United States Patent [19]

Liu et al.

[11] Patent Number: 5,693,568
[45] Date of Patent: Dec. 2, 1997

[54] REVERSE DAMASCENE VIA STRUCTURES

[75] Inventors: Yowjuang W. Liu, San Jose; Kuang-Yeh Chang, Los Gatos, both of Calif.

[73] Assignee: Advanced Micro Devices, Inc., Sunnyvale, Calif.

[21] Appl. No.: 572,317

[22] Filed: Dec. 14, 1995

[51] Int. Cl.$^6$ ................................. H01L 21/44
[52] U.S. Cl. .................. 437/195; 437/228; 437/245
[58] Field of Search ........................ 437/195, 192, 437/194, 190, 228, 245

[56] References Cited

U.S. PATENT DOCUMENTS

| | | |
|---|---|---|
| 4,536,951 | 8/1985 | Rhodes et al. . |
| 4,914,056 | 4/1990 | Okumura .................. 437/192 |
| 4,954,423 | 9/1990 | McMann et al. . |
| 4,996,133 | 2/1991 | Brighton et al. . |
| 5,055,426 | 10/1991 | Manning .................. 437/195 |
| 5,093,279 | 3/1992 | Andreshak et al. . |
| 5,262,354 | 11/1993 | Cote et al. . |
| 5,380,679 | 1/1995 | Kano . |
| 5,512,514 | 4/1996 | Lee .................. 437/195 |

FOREIGN PATENT DOCUMENTS

| | | |
|---|---|---|
| 0129389 A2 | 12/1984 | European Pat. Off. . |
| 0329969 A1 | 8/1989 | European Pat. Off. . |
| 0542262 A1 | 5/1993 | European Pat. Off. . |

OTHER PUBLICATIONS

Joshi, "A New Damascene Structure for Submicrometer Interconnect Wiring," IEEE Electron Device Letters, vol. 14, No. 3, Mar. 1993, pp. 129–132.

Kaanta et al., "Dual Damascene: A ULSI Wiring Technology," Jun. 11–12, 1991 VMIC Conference, pp. 144–152.

Kenney et al., "A Buried-Plate Trench Cell for a 64-Mb DRAM," 1992 Symposium on VLSI Technology Digest of Technical Papers, pp. 14–15.

*Primary Examiner*—John Niebling
*Assistant Examiner*—C. Everhart
*Attorney, Agent, or Firm*—Lowe, Price, LeBlanc & Becker

[57] ABSTRACT

A reliable interconnection pattern is formed by depositing first and second conductive layers, etching to form a conductive pattern in the first conductive layer and etching to form an interconnection comprising a portion of the second conductive layer. Advantageously, the need to form openings in dielectric layers, and filling them with barrier materials and plugs, is avoided along with their attendant disadvantages. The resulting semiconductor device exhibits improved reliability, higher operating speeds and an improved signal-to-noise ratio.

22 Claims, 5 Drawing Sheets

REVERSE DAMASCENE VIA STRUCTURES

TECHNICAL FIELD

The present invention relates to a semiconductor device comprising a plurality of electrically interconnected conductive layers, and to a method for forming the interconnection structure. The invention is applicable in high speed integrated circuits, particularly integrated circuits having submicron design features.

BACKGROUND ART

Conventional semiconductor devices comprise a semiconductor substrate, normally made of monocrystalline silicon, and a plurality of sequentially formed dielectric interlayers and conductive layers thereon. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by conductive vias.

A conductive via is typically formed by depositing a dielectric interlayer on a conductive layer comprising at least one conductive pattern, forming an opening through the dielectric interlayer by conventional photolithographic and etching techniques, and filling the opening with a conductive material, such as tungsten. One such method is known as damascene and basically involves the formation of a trench which is filled in with a metal. In copending application Ser. No. 08/320,516 filed on Oct. 11, 1994, prior art single and dual damascene techniques are disclosed, in addition to several improved dual damascene techniques for greater accuracy in forming fine line patterns with minimal interwiring spacings.

The conventional practice of forming a via by etching an opening through a dielectric interlayer to a conductive pattern on an underlying conductive layer, and filling in the opening with a metal involves complicated manipulative steps and is attendant upon numerous disadvantages. Such disadvantages include contamination often leading to corrosion. Various problems stem from photolithographic techniques to form openings, etching and filling the vias, particularly in submicron technology required to satisfy increased densification requirements and performance in ultra-large scale integration semiconductor technology. Such problems lead to unreliable contacts, lower operating speeds and poor signal-to-noise ratio.

As the design requirements for interconnection patterns become more severe, including the requirement for minimal dimensions, such as vias having a dimension less than about 0.35 microns, particularly less than about 0.25 microns, the ability of conventional photolithographic techniques to satisfy such demands with satisfactory accuracy becomes increasingly more difficult. The limitation on achieving such fine dimensions resides in the inability of conventional photolithographic and etching techniques to satisfy the accuracy requirements for such fine patterns. Conventionally, in forming patterns having a small dimension, such as about 0.30 to about 0.40 microns or greater, I-line photolithography is employed. As the maximum dimension is reduced, e.g., to below about 0.30 microns, such as less than about 0.25 microns, it is necessary to resort to shorter wavelengths, such as deep ultra-violet light. It is, however, very difficult to form fine line patterns with a maximum dimension of about 0.25 microns or less with any reasonable degree of accuracy, consistency and efficiency, and to produce a controlled sidewall by a simple etching process. It is even more difficult to form through holes, such as contacts and vias, in insulating layers having such small geometries, due to proximity effects.

Another problem encountered in forming conventional vias stems from the need to etch an opening in a dielectric interlayer. Conventionally, overetching is conducted in order to ensure forming a complete opening for proper electrical interconnection. In order to ensure a fully open contact, overetching is conducted so that a portion of the underlying metal is etched away, thereby adversely affecting contact resistance and contact reliability, particularly electromigration effects. If an etch stop material is used, punch-through occurs, whereby the underlying conductive layer is also etched, thereby creating nonuniformities.

Another problem stems from the need to fill a created opening, particularly a submicron opening, with metal, particularly an opening having a high aspect ratio. Porosity problems are encountered which are believed to stem from, in part, stresses created during solidification and crystallization of metal in the opening. Center line cracking has been encountered, thereby severely decreasing the performance and reliability of the interconnection. Another disadvantage stems from the requirement to provide a barrier layer between the conductive material of the via and the conductive pattern to avoid diffusion, thereby requiring additional equipment and manipulative steps.

Another problem encountered in conventional via forming techniques stems from contamination caused by, inter alia, reaction products of etching with dielectric material, particularly spin-on glass. Misalignment problems also occur between an opening and an underlying conductive pattern. If misalignment occurs, etching continues through any underlying dielectric.

The escalating requirements of current carrying capacity and higher operating speeds, particularly in ultra-large scale integration semiconductor technology, require corresponding improvements in the formation of interconnection structures, particularly vias.

DISCLOSURE OF THE INVENTION

An object of the present invention is a semiconductor device having an interconnection structure exhibiting high operating speeds and improved signal-to-noise ratio, wear characteristics, linearity and reliability.

Another object of the present invention is a method of producing a semiconductor device having an interconnection structure with high operating speeds and improved signal-to-noise ratio, linearity, wear characteristics and reliability.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the forgoing and other objects are achieved in part by a semiconductor device comprising a semiconductor substrate; a plurality of sequential dielectric and conductive layers formed thereon, each conductive layer comprising at least one conductive pattern; and at least one interconnection electrically connecting the conductive patterns of upper and lower conductive layers; wherein the interconnection comprises a portion of a conductive layer deposited on and in electrical contact with the lower conductive layer.

Another aspect of the present invention is a method of manufacturing a semiconductor device, which method comprises: depositing a plurality of sequential dielectric and conductive layers on a semiconductor substrate, each conductive layer comprising at least one conductive pattern; and forming an interconnection electrically connecting a conductive pattern of an upper conductive layer and a conductive pattern of a lower conductive layer by: depositing a first lower conductive layer; depositing a second conductive layer on and in electrical contact with the first conductive layer; and etching the second conductive layer to form at least a portion of the interconnection from the remaining second conductive layer.

A further aspect of the present invention is a method of manufacturing a semiconductor device, which method comprises depositing a first dielectric interlayer on a semiconductor substrate; depositing a first lower conductive layer on the first dielectric interlayer; depositing a second conductive layer on and in electrical contact with the first conductive layer; etching the first and second conductive layers to form at least one conductive pattern; forming a second dielectric interlayer; etching the second conductive layer without substantially etching the first lower conductive layer to define at least a portion of an interconnection comprising remaining second conductive layer on and in electrical contact with a conductive pattern of the first lower conductive layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention is directed to a semiconductor device and to a method of manufacturing a semiconductor device, wherein the semiconductor device comprises a plurality of sequentially formed dielectric interlayers and conductive layers, each conductive layer comprising at least one conductive pattern, and a plurality of interconnections electrically interconnecting the conductive patterns of different conductive layers. The present invention is particularly suitable in semiconductor devices having minimal design feature sizes and spacings, particularly less than about 0.35 microns. The present invention provides a semiconductor device having an improved interconnection pattern enabling the attainment of higher operating speeds and improved signal-to-noise ratio, linearity and wear characteristics and efficiency, by a simplified and cost-effective technique which departs from conventional practices of electrically connecting conductive patterns of different levels by forming vias. The present invention avoids the numerous disadvantages attendant upon forming an electrically conductive via by etching a through hole in a dielectric interlayer and filling the through hole with a conductive material, such as a metal.

The conventional practice of forming a via by etching an opening in a dielectric interlayer and filling it with metal is attendant upon numerous disadvantages. For example, as the design rule for semiconductor devices requires small and smaller feature sizes and spacings, it is increasingly difficult to accurately form openings submicron size, particularly below about 0.35 microns, in a dielectric interlayer. It is also very difficult to completely fill small openings in a dielectric interlayer, particularly openings having a high aspect ratio, without formation of porosity and center line cracking which severely reduces the reliability of the resulting interconnection pattern due to current crowding problems. The formation of submicron openings also strains the limits of conventional photolithographic equipment. The formation of openings in dielectric interlayers to reach an underlying conductive pattern is subject to misalignment. Moreover, reaction products formed from dielectric layers and etches, typically spin-on-glass (SOG), results in contamination of the via.

Conventional via formation practices also involve complex sequence of steps which require the use of a barrier metal to be initially deposited in the opening to prevent diffusion. The deposition of the main interconnection metal, typically tungsten, is processed which is often difficult to conduct a contamination free manner as required in the production of sensitive semiconductor devices. Conventional practices also require the use of a capping layer on the plug which requires additional equipment and expense. The resulting vias typically exhibit a higher resistance than optimal. By the present invention, these manipulative steps and attendant expenses are eliminated and a reliable interconnection formed in a simplified, cost-effective and contamination free manner. Moreover, the technique of forming interconnections in accordance with the present invention can be integrated into existing semiconductor processing technology in a simplified manner.

The present invention departs from conventional via formation practices by depositing a layer of conductive material on and in electrical contact with a conductive layer in which conductive patterns are formed. The overlying layer of conductive material is then etched leaving at least a portion of the interconnection comprising the remaining second conductive layer on and in electrical contact with the underlying conductive pattern. Thus, the present invention dramatically departs from the conventional practice of depositing a dielectric interlayer, forming an opening therein, and filling the opening with conductive material, such as a metal, to form a via. Rather, the present invention comprises depositing a conductive layer on and in electrical contact with an underlying conductive layer in which a conductive pattern is formed. The interconnection between conductive patterns of different levels is formed simply by etching the deposited conductive layer. In a preferred embodiment of the present invention, an etch stop layer is deposited on and in electrical contact between the underlying conductive layer and the conductive layer from which the interconnection is formed, to facilitate determining the etching end point.

In accordance with the present invention, the interconnection between conductive patterns on different conductive layers or levels is basically formed by etching away portions of a deposited conductive layer comprising conductive material. Preferably, the conductive material is a metal, such as aluminum, an aluminum-based alloy, copper, a copper-based alloy, silver, or a silver-based alloys. The present invention, thereby, avoids the many disadvantages attendant upon conventional via formation practices wherein an opening is formed in a dielectric interlayer and filled with a metal such as tungsten.

An advantage stemming from the present invention wherein an electrical connection is formed from a portion of a deposited metal layer is a significant reduction in porosity vis-à-vis a conventionally formed via. While not wishing to be bound to any particular theory, it is believed that the present invention avoids the stresses generated in depositing and solidifying a metal within an opening, particularly a narrow opening in a dielectric layer, which cause the formation of voids. Furthermore, the center line cracking which frequently occurs due to the solidification pattern and stresses within an opening is avoided. Such voids and cracking frequently form shorts upon thermal cycling during conventional semiconductor processing steps. Basically, the metal interconnection of the present invention exhibits a microstructure similar to the microstructure of the underlying metal layer and metal pattern. Moreover, since the interconnection is deposited in electrical contact with the underlying metal layer, the unreliability problem of conventional vias are avoided and there is no danger of misalignment. Indeed, the interconnections of the present invention are formed with improved reliability in a simplified manner without the painstaking steps and costly equipment required in conventional via formation practices. The interconnections of the present invention also exhibit significantly reduced resistance with resulting improvements in noise margin and signal integrity.

In accordance with a preferred embodiment of the present invention, and etch stop layer is deposited on an in electrical contact with the underlying conductive layer in which a conductive pattern is formed. The overlying conductive layer, from which the interconnection is formed, is then deposited on and in electrical contact with the etch stop layer. Thus, the overlying conductive layer is deposited in electrical contact with the underlying conductive layer. In a preferred aspect of this embodiment, the etch stop layer and overlying conductive layer are formed essentially coextensive in length with the underlying conductive layer.

Thus, in accordance with a preferred embodiment of the present invention, a three layer sandwich is formed comprising a first lower conductive layer, a thin etch stop layer on and in electrical contact with the first lower conductive layer, and a second conductive layer on and in electrical contact with the etch stop layer. Preferably, the etch stop layer comprises a material conventionally employed for an etch stop layer in the art of manufacturing semiconductors, such as titanium, tungsten, an alloy thereof or a nitride thereof.

In accordance with the present invention, a plurality of sequential dielectric interlayers and conductive layers are formed on a semiconductor substrate, each conductive layer comprising at least one conductive pattern. A reliable interconnection electrically connecting the conductive patterns of an upper conductive layer and a lower conductive layer is formed in a simplified, cost-effective manner. The interconnection is formed by depositing a first lower conductive layer, and depositing a second conductive layer on and in electrical contact with the first conductive layer, preferably with an etch stop layer therebetween and in electrical contact with both the lower first conductive layer and upper second conductive layer. The first and second conductive layers, and interpositioned etch stop layer, are then etched to form at least one conductive pattern, employing conventional photolithographic and etching techniques. A second etching step is then performed, employing conventional photographic and etching techniques, to remove portions of the second conductive layer up to the etch stop layer without any substantial etching the lower conductive layer to form an interconnection comprising remaining second conductive layer. The present technique of forming an interconnection is extremely simplified vis-à-vis conventional via formation practices which involve etching a hole completely through a dielectric layer. In order to achieve reliable contact between conductive patterns of different conductive layers or levels, the hole in the dielectric layer, of submicron size, must be etched completely through the dielectric layer in order to achieve reliable contact. In order to ensure the formation of a complete throughhole, overetching is typically conducted which creates further problems in damaging the underlying conductive layer. In accordance with the present invention, a metal layer is deposited in electrical contact with the conductive layer from which the conductive pattern is formed. Hence, there are no reliability problems as in formation of a throughhole through a dielectric layer. In accordance with the present invention, overetching is not purposely performed and the underlying lower first conductive layer need not be etched at all.

The present invention also comprises a method of manufacturing a semiconductor device having an interconnection pattern exhibiting higher operating speeds and improved signal-to-noise ratio, linearity, efficiency, and wear characteristics in a simplified and cost-effective manner. In accordance with the present invention, the interconnections are formed electrically connecting conductive patterns on different conductive levels subsequent to initial conventional semiconductor processing wherein a first dielectric layer is deposited on a semiconductor substrate having active regions, and contacts formed in electrical connection with the active regions by forming holes through the first dielectric layer and filling the holes with tungsten.

Figure 1:
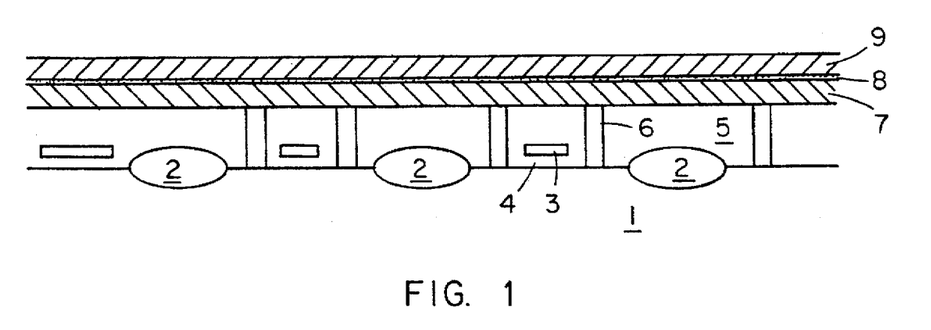
FIGS. 1 through 8 represent sequential stages of a method in accordance with the present invention.

As shown in FIG. 1, a semiconductor substrate is provided with active regions formed in the substrate isolated by field oxide regions 2. A gate electrode 3 is formed above the active regions with a gate oxide 4 therebetween. A first dielectric interlayer 5 is formed on the semiconductor substrate and planarized in accordance with conventional practices, such as by etching or chemical-mechanical polishing. Openings are formed through first dielectric interlayer 5 and filled in with a metal, such as tungsten, in accordance with conventional practices, to form a contact 6 in electrical connection with an active region in semiconductor substrate 1. At this point, the present invention departs from conventional practices in forming an interconnection pattern wherein conductive patterns of different conductive levels are electrically connected.

As shown in FIG. 1, a first lower conductive layer 7, such as aluminum, is deposited on first lower dielectric layer 5. Similar elements depicted in FIGS. 1 through 9 bear similar reference numerals. In accordance with a preferred embodiment of the present invention, an etch stop layer 8, such as titanium nitride, is deposited on and in electrical contact with the first lower conductive layer 7, and a second conductive layer, such as aluminum, is deposited on and in electrical contact with etch stop layer 8. Thus, a three-layer sandwich comprising two conductive layers and an intermediate conductive etch stop layer is formed. The three-layer sandwich is deposited by conventional deposition techniques, such as sputtering or chemical vapor deposition (CVD).

In accordance with the present invention, each conductive layer can comprise a plurality of layers including, for example, a barrier layer, a glue layer and/or an anti-reflective layer.

In accordance with the present invention, a conductive pattern is formed in first lower conductive layer 7, and a reliable interconnection thereto is formed by etching away portions of the second conductive layer 9 already in electrical contact therewith. A mask (not shown) is formed on second conductive layer 9, which mask defines at least one conductive pattern, typically comprising a plurality of spaced apart conductive lines. Etching is then conducted employing conventional and photolithographic and etching techniques to define at least one conductive pattern 10 as shown in FIG. 2.

Figure 2:
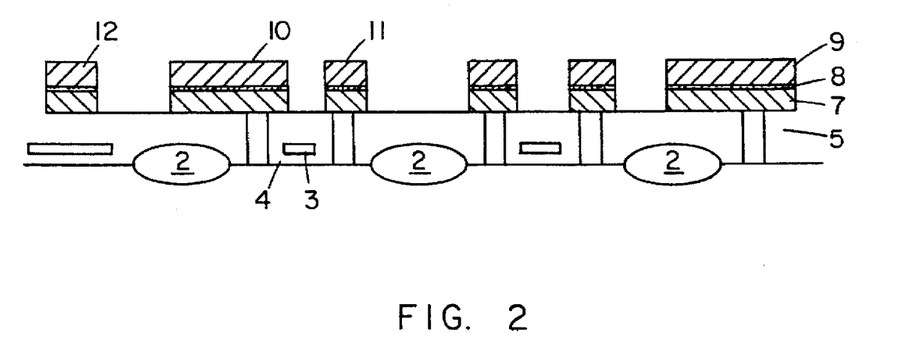

As shown in FIG. 2, subsequent to etching, first conductive layer 7, etch stop layer 8 and second conductive layer 9, define a conductive pattern 10, a conductive line 11 and an interconnection 12, each formed of a three-layer sandwich comprising lower conductive layer 7, etch stop layer 8 and second conductive layer 9. After etching the three-layer sandwich of first lower conductive layer 7, etch stop layer 8 and second conductive layer 9, a dielectric material is deposited to fill in spaces formed by removing portions of the three-layer sandwich and planarized to form second dielectric 30 (FIG. 3) and to expose remaining portions of second conductive layer 9.

Figure 3:
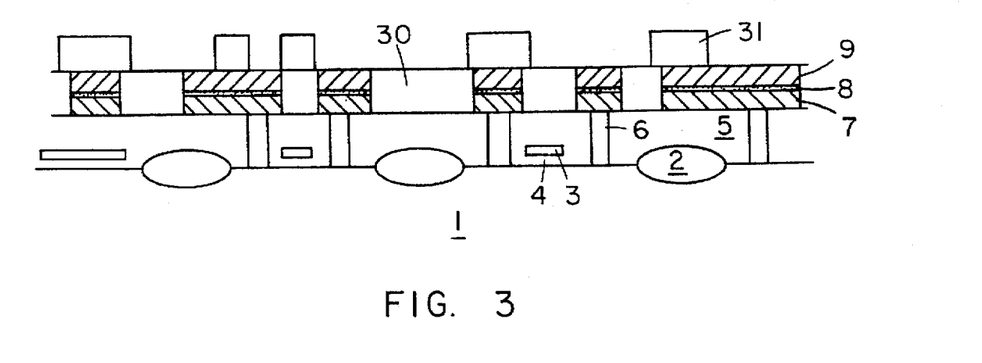
Figure 4:
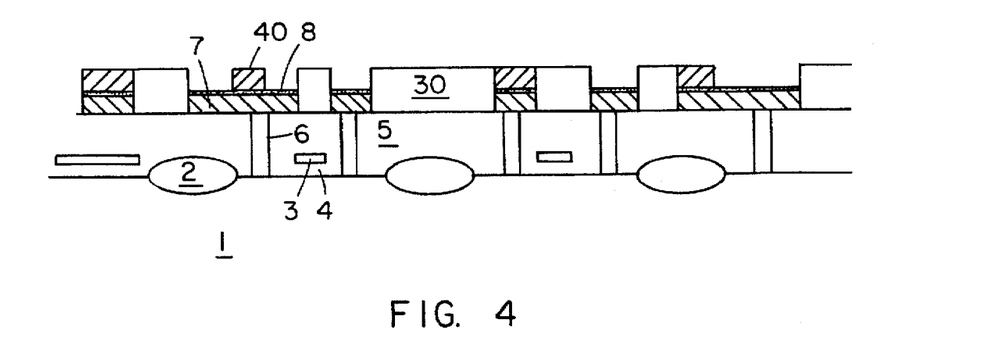

As shown in FIG. 3, an open field resist mask 31 is applied which essentially corresponds to the reverse of a dark field mask employed to form openings in a dielectric interlayer employing a positive photoresist technique in conventional via formation practices. Resist mask 31 defines a pattern comprising interconnections for electrically connecting conductive patterns of the first conductive level. Etching is then conducted to form an interconnection 40, as shown in FIG. 4, already in reliable electrical contact with a conductive pattern in first lower conductive layer 7 through conductive etch stop layer 8. Thus, as shown in FIG. 4, an electrical interconnection 40 is formed in a simplified cost-effective manner by simply etching the second conductive layer 9, without forming an opening through a dielectric interlayer and filling the opening with metal, thereby avoiding the attendant disadvantages attendant upon conventional via formation practices. Moreover, the present invention enables the use of low resistance metals, such as aluminum, copper, gold, silver and alloys thereof, thereby enabling formation of low resistance interconnections. In addition, the present invention enables a significant increase in the tolerance involved in forming an accurate electrical connection between conductive wiring patterns on different levels.

Figure 5:
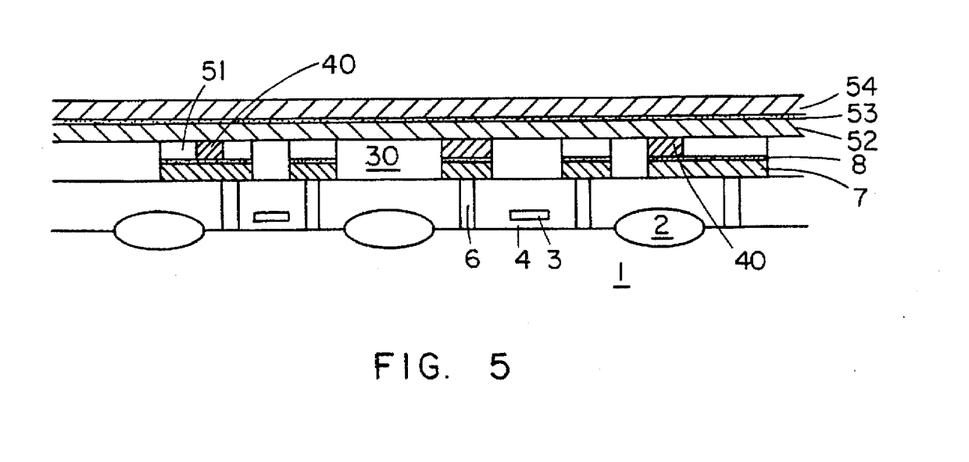

As depicted in FIG. 5, dielectric material 51 is applied and planarized in a conventional manner, as by etching or chemical-mechanical polishing, to complete second dielectric interlayer 30 and to expose remaining portions of second conductive layer 9, such as interconnection 40. Another sandwich of conductive layers is then deposited, preferably another three-layer sandwich comprising third conductive layer 52, etch stop layer 53 in electrical contact with third conductive layer 53 and fourth conductive layer 54 in electrical contact with etch stop layer 53, by conventional deposition techniques. Preferably, conductive layer 52 and conductive layer 54 comprise the same conductive material, such as a metal, preferably aluminum.

Figure 6:
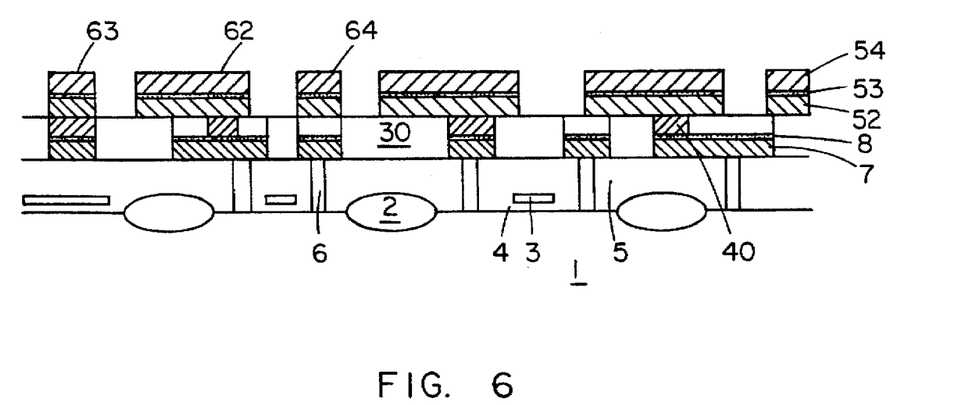
Figure 7:
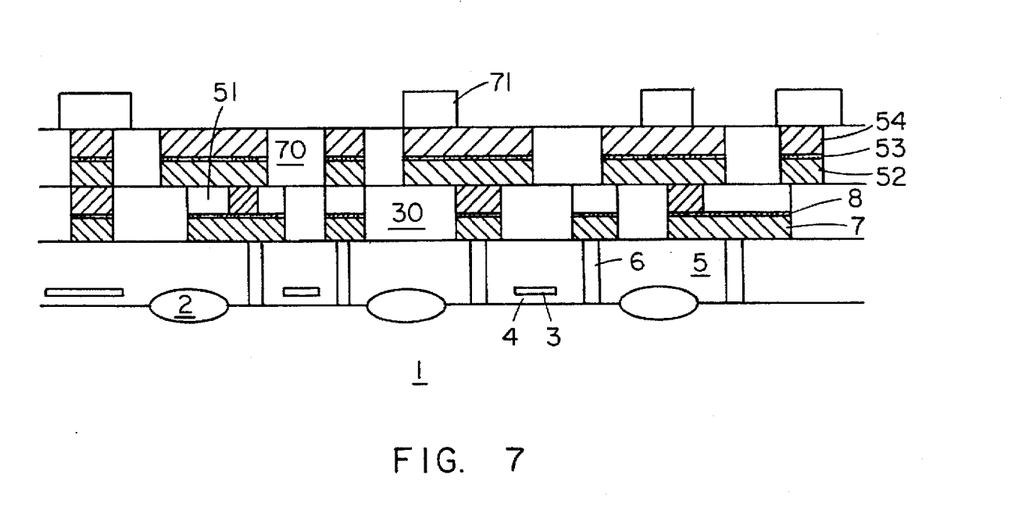
Figure 8:
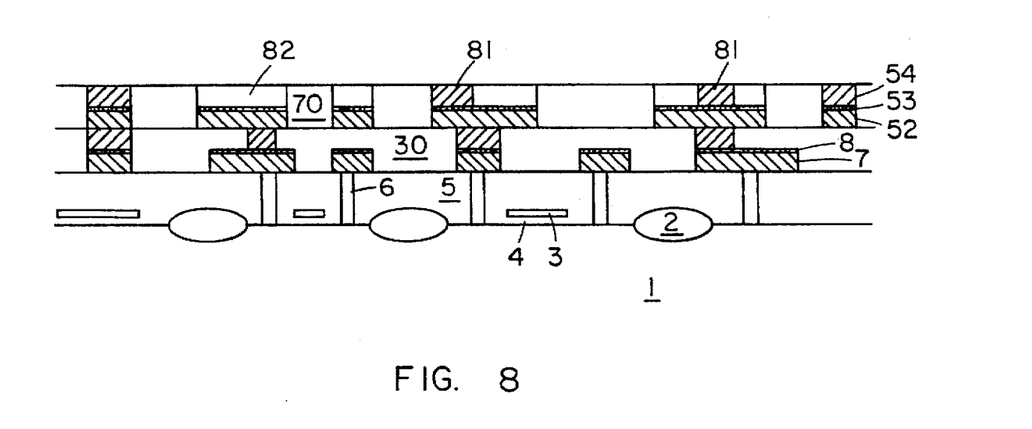

Procedures are then followed similar to those employed to form the conductive pattern on the first lower conductive layer 7 and interconnection from portions of second conductive layer 8. Thus, a mask is provided (not shown) and, employing conventional photolithographic and etching techniques, a second conductive pattern 62, interconnection 63 and conductive line 64 are formed. As shown in FIG. 7, third dielectric interlayer 70 is deposited and planarized to expose remaining portions of fourth conductive layer 54. A mask 71 is applied and etching is conducted to form interconnections 81 already in electrical contact with the conductive patterns in third conductive layer 52, as seen in FIG. 8. Additional dielectric material 82 is applied and planarization is conducted, to complete third dielectric interlayer 70 and to expose remaining portions of fourth conductive layer 54, such as interconnections 81.

Figure 9:
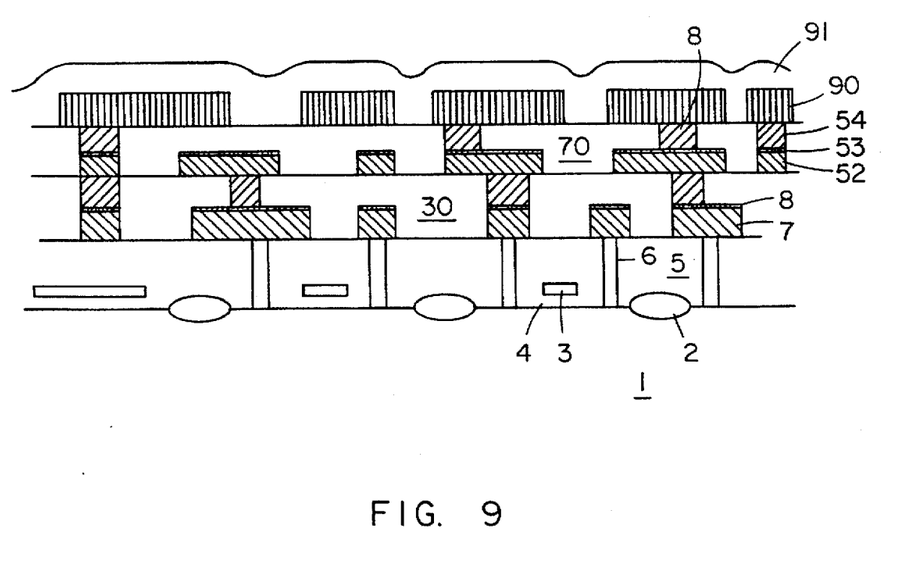
FIG. 9 schematically depicts a cross-section of a semiconductor device formed in accordance with the present invention.

As shown in FIG. 9, a fifth upper or pad bonding conductive layer 90 is deposited and patterned in a conventional manner. A top coat dielectric layer 92 is then applied, also in accordance with conventional practices.

Thus, in accordance with the present invention, a simplified and cost-effective method is provided to form reliable interconnections electrically connecting conductive patterns of different levels and between electrical contacts to the active regions of the semiconductor substrate and overlying electrical conductive patterns. The present invention avoids disadvantages attendant upon conventional interconnection practices and avoids numerous problem causing conventional processing steps, notably via dielectric etching, via/metal interface problems, contamination, misalignment, unreliable electrical connections, and high resistance vias.

The present method enables the formation of interconnections in a manner which is significantly more efficient and cost-effective than conventional processes, including conventional damascene processes. The present invention enables the obtainment of topography with consistently better planarity than obtained with conventional practices. The present invention eliminates the requirement for barrier and capping layers in a via and attendant additional equipment, materials and processing steps. The present invention also avoids the possibility of misalignment, thereby improving process tolerances, and permits intricate and tighter design layouts. Interconnection liabilities are avoided by reducing electromigration and contacts/via current crowding.

The semiconductor devices produced in accordance with the present invention exhibit improved circuit performance and lower resistance capacitance (RC) delays. The semiconductor device produced in accordance with the present invention, therefore, exhibits higher operating speeds, and improved signal-to-noise ratio, linearity and wear characteristics, employing a simplified, efficient, cost-effective process. The present invention is not limited to any particular type of semiconductor device, and can be employed in the production of various types of semiconductor devices, particular semiconductor devices having submicron circuitry designed for high operating speeds. The present invention is not limited to the depicted embodiments comprising a plurality of metal layers, but is applicable to semiconductor devices having one or more metal layers.

In manufacturing a semiconductor device in accordance with the present invention, generally conventional photolithographic, etching and deposition techniques can be employed. For example, in carrying out the various embodiments of the present invention, conventional metallization techniques can be employed for the deposition of conductive layers, such as melting, sputtering, evaporation and various types of chemical vapor deposition (CVD) processes, including low pressure chemical vapor deposition (LPCVD), and plasma enhanced chemical vapor deposition (PECVD). Normally, when high melting point metals are deposited, CVD techniques are employed. Low melting point metals, such as aluminum and aluminum-base alloys, may be deposited by melting or sputtering. Polysilicon or polycide (a composite of polysilicon and a metal silicide) can also be employed as a conductive material in the interconnection pattern. The various layers are planarized by known planarization techniques, such as etching and chemical-mechanical polishing techniques.

In accordance with the present invention, the performance capabilities and characteristics of a semiconductor device are enhanced in a simplified, efficient, cost-effective and reliable manner of forming an interconnection pattern. The present invention avoids the disadvantages attendant upon conventional via formation practices comprising forming openings in dielectric interlayers and filling the openings with metal. The present invention provides reliable electrical interconnections by depositing a layer of metal in electrical contact with an underlying conductive layer, and etching to form the interconnections. The resulting semiconductor device exhibits higher operating speeds, and improved signal-to-noise ratio, efficiency, linearity and wear characteristics, while avoiding numerous disadvantages attendant upon conventional via formation and via filling procedures. The disclosed embodiments and concepts of the present invention are applicable in any type of semiconductor device wherein interconnection patterns are formed.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device, which method comprises:
   depositing a plurality of sequential dielectric and conductive layers on a semiconductor substrate, each conductive layer comprising at least one conductive pattern; and
   forming an interconnection electrically connecting a conductive pattern of an upper conductive layer and a conductive pattern of a lower conductive layer by:
   depositing a first lower conductive layer;
   depositing a second conductive layer on and in electrical contact with the first conductive layer;
   etching the first lower conductive layer to form a conductive pattern comprising a conductive line; and
   etching the second conductive layer, after etching the first lower conductive layer, to form at least a portion of the interconnection from the remaining second conductive layer, wherein the width of the portion of the interconnection is less than the width of an underlying electrically connected etched conductive line.

2. The method according to claim 1, further comprising:
   depositing a layer of etch stop material on and in electrical contact with the first lower conductive layer; and
   depositing the second conductive layer on and in electrical contact with the etch stop material.

3. The method according to claim 1, wherein the etch stop material comprises tungsten, titanium, an alloy thereof, or a nitride thereof.

4. The method according to claim 1, wherein the interconnection comprises a metal selected from the group consisting of aluminum, aluminum-based alloys, copper, copper-based alloys, gold, gold-based alloys, silver, and silver-based alloys.

5. The method according to claim 1, wherein the first lower conductive layer and the second conductive layer comprise the same metal.

6. The method according to claim 5, wherein the metal is selected from the group consisting of aluminum, aluminum-based alloys, copper, copper-based alloys, silver and silver-based alloys.

7. The method according to claim 1, wherein the second conductive layer is deposited coextensive with the first lower conductive layer.

8. A method of manufacturing a semiconductor device, which method comprises:
   depositing a first dielectric interlayer on a semiconductor substrate;
   depositing a first lower conductive layer on the first dielectric interlayer;
   depositing a second conductive layer on and in electrical contact with the first conductive layer;
   etching the first and second conductive layers to form at least one conductive pattern;
   forming a second dielectric interlayer;
   etching the second conductive layer, after forming the second dielectric interlayer, without substantially etching the first lower conductive layer to define at least a portion of an interconnection comprising remaining second conductive layer on and in electrical contact with a conductive pattern of the first lower conductive layer.

9. The method according to claim 8, further comprising:
   depositing a third conductive layer on the second dielectric interlayer and on and in electrical contact with an exposed interconnection;
   depositing a fourth conductive layer on and in electrical contact with the third conductive layer;
   etching the third and fourth conductive layers to form at least one conductive pattern;
   depositing a third dielectric interlayer;
   etching the fourth conductive layer without substantially etching the third conductive layer to define at least a portion of an interconnection comprising the remaining fourth conductive layer in electrical contact with a conductive pattern of the third conductive layer.

10. The method according to claim 9, further comprising:
    forming a third dielectric interlayer;
    depositing a fifth conductive layer on the third dielectric interlayer and on and in electrical contact with an exposed interconnection; and
    etching the fifth conductive layer to form at least one conductive pattern.

11. The method according to claim 10, further comprising depositing a topside dielectric layer.

12. The method according to claim 8, wherein the first lower conductive layer and second conductive layer comprises the same metal selected from the group consisting of aluminum, aluminum-based alloys, gold, gold-based alloys, silver, silver-based alloys, copper and copper-based alloys.

13. The method according to claim 8, further comprising:
    depositing a layer of etch stop material on and in electrical contact with the first lower conductive layer; and
    depositing the second conductive layer on and in electrical contact with the etch stop layer.

14. The method according to claim 13, wherein the etch stop comprises tungsten, titanium, an alloy thereof or a nitride thereof.

15. The method according to claim 8, further comprising:

depositing a layer of dielectric material after etching the first and second conductive layers and prior to etching the second conductive layer; and planarizing to expose a remaining portion of the second conductive layer and form the second dielectric interlayer.

16. The method according to claim 15, further comprising applying a photomask prior to etching the second conductive layer to define at least a portion of an interconnection.

17. The method according to claim 8, further comprising:

depositing a dielectric material after etching the second conductive layer to fill in the second dielectric interlayer; and planarizing to expose an interconnection.

18. The method according to claim 9, further comprising:

depositing a layer of etch stop material on and in electrical contact with the third conductive layer; and depositing the fourth conductive layer on and in electrical contact with the etch stop layer.

19. The method according to claim 18, wherein the etch stop layer comprises tungsten, titanium, an alloy thereof or a nitride thereof.

20. The method according to claim 8, further comprising:

forming at least one active region in the semiconductor substrate prior to depositing the first dielectric interlayer;

forming an opening in the first dielectric interlayer exposing a portion of an active region in the semiconductor substrate prior to depositing the first lower conductive layer;

filling the opening with conductive material; and depositing the first lower conductive layer on the first dielectric layer in electrical contact with the conductive material in the opening.

21. The method according to claim 1, comprising etching the second conductive layer to form a portion of the interconnection having a side surface substantially vertically aligned with a side surface of the underlying electrically connected etched conductive line.

22. The method according to claim 8, wherein the width of the portion of the interconnection is less than the width of an underlying electrically connected conductive line.

\* \* \* \* \*

UNITED STATES PATENT AND TRADEMARK OFFICE
CERTIFICATE OF CORRECTION

PATENT NO. : 5,693,568
DATED : December 2, 1997
INVENTOR(S) : Yowjuang W. LIU et al.

It is certified that error appears in the above-identified patent and that said Letters Patent is hereby corrected as shown below:

In the Claims, Claim 3 should read as follows:

--3. The method according to claim 2, wherein the etch stop material comprises tungsten, titanium, an alloy thereof, or a nitride thereof.--

Signed and Sealed this

Twenty-seventh Day of October, 1998

Attest:

BRUCE LEHMAN

Attesting Officer

Commissioner of Patents and Trademarks